(12) United States Patent
Yoo

(10) Patent No.: US 6,387,774 B1
(45) Date of Patent: *May 14, 2002

(54) METHODS FOR FORMING PATTERNED LAYERS INCLUDING NOTCHED ETCHING MASKS

(75) Inventor: Won Jong Yoo, Seoul (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/922,628

(22) Filed: Sep. 3, 1997

(30) Foreign Application Priority Data

Dec. 17, 1996 (KR) .............................. 96-66946

(51) Int. Cl.⁷ .......................................... H01L 21/8242
(52) U.S. Cl. ........................... 438/396; 438/3; 438/240; 438/250; 438/253; 438/393; 438/396; 438/945; 438/720
(58) Field of Search ................................ 257/306, 310; 438/3, 240, 250, 253, 393, 396, 945, 720; 156/646.1; 216/6

(56) References Cited

U.S. PATENT DOCUMENTS

| | | | | |
|---|---|---|---|---|
| 5,298,459 A | * | 3/1994 | Arikawa et al. ............. | 438/614 |
| 5,332,653 A | * | 7/1994 | Cullen et al. ................ | 430/323 |
| 5,500,386 A | * | 3/1996 | Matsumoto et al. ......... | 438/396 |
| 5,515,984 A | * | 5/1996 | Yokoyama et al. .......... | 216/41 |
| 5,527,729 A | * | 6/1996 | Matsumoto et al. ......... | 438/396 |
| 5,582,679 A | * | 12/1996 | Lianjun et al. .............. | 438/669 |
| 5,621,606 A | * | 4/1997 | Hwang ...................... | 361/321.4 |
| 5,658,820 A | * | 8/1997 | Chung ............................ | 438/3 |
| 5,930,639 A | * | 7/1999 | Schuele et al. ............. | 438/396 |

FOREIGN PATENT DOCUMENTS

| | | | | |
|---|---|---|---|---|
| JP | 06-5719 | * | 1/1994 | ......... H01L/021/90 |
| JP | 06-5810 | * | 1/1994 | ....... H01L/027/108 |
| JP | 06-13357 | * | 1/1994 | ....... H01L/021/302 |
| JP | 07-130702 | * | 4/1995 | ....... H01L/021/305 |
| KR | 96-66946 | * | 1/1999 | |

OTHER PUBLICATIONS

Won Jong Yoo et al., Control of Etch Slope During Etching of Pt in $Ar/Cl_2/O_2$ Plasmas, Jpn. J. Appl. Phys., vol. 5, Part 1, No. 4B, Apr. 1996, pp. 2501–2504.

* cited by examiner

Primary Examiner—Carl Whitehead, Jr.
Assistant Examiner—Toniae M. Thomas
(74) Attorney, Agent, or Firm—Myers Bigel Sibley & Sajovec

(57) ABSTRACT

A method for patterning a layer of a microelectronic device includes the step of forming an etching mask on the layer to be etched opposite the microelectronic substrate. The etching mask defines exposed portions of the material layer and the etching mask has a notch in the sidewall thereof adjacent the material layer. The exposed portions of the material layer are then etched. More particularly, the step of forming the etching mask can include the steps of forming a first patterned mask layer on the layer to be etched and forming a second patterned mask layer on the first patterned mask layer wherein the second patterned mask layer extends beyond the first patterned mask layer thereby defining the notch in the sidewall of the etching mask.

31 Claims, 3 Drawing Sheets

METHODS FOR FORMING PATTERNED LAYERS INCLUDING NOTCHED ETCHING MASKS

FIELD OF THE INVENTION

The present invention relates to the field of microelectronics and more particularly to methods for patterning microelectronic layers.

BACKGROUND OF THE INVENTION

As integrated circuit memory devices such as dynamic random access memories (DRAMs) become more highly integrated, the space available for each memory cell on the substrate is reduced. Accordingly, the space available for memory cell capacitors is also reduced making it more difficult to maintain the desired memory cell capacitance as integration densities increase. It may be particularly difficult to provide desired memory cell capacitances using conventional dielectric materials such as nitride/oxide (NO) or $Ta_2O_5$.

There have thus been efforts to develop capacitor dielectric layers from materials having dielectric constants more than 100 times higher than that of NO. In particular, materials such as $(Ba,Sr)TiO_3$ ("BST") and $(Pb,Zr)TiO_3$ ("PZT") have been used to provide dielectric layers for memory cell capacitors. Dielectric layers formed from these materials can thus be used to increase the capacitance of a memory cell capacitor without increasing the surface area of the capacitor electrodes. When using BST or PZT to provide capacitor dielectric layers, however, Pt is generally used to provide the capacitor electrodes because Pt is relatively inert to the oxidation which may occur as a result of the high diffusivity of BST and PZT.

Pt electrodes, however, may be difficult to pattern because Pt does not readily react with conventional etching chemicals, and Pt is not easily etched using dry etching techniques such as reactive ion etching. In other words, it may be difficult to pattern a platinum layer using a conventional reactive ion etch because the reactivity between the halogen gas used in a reactive ion etch and platinum is relatively low. Other metals such as Ru and Ir may also be difficult to pattern because they are also relatively inert.

Sputtering techniques using relatively high ion energies have been developed to pattern electrodes from layers of an inert material such as Pt. When etching Pt layers using ion sputtering, however, redeposits may be formed on the sidewall of the etching mask, and the slope of the sidewall of the platinum electrode formed thereby may be reduced. The sputter etching of Pt layers is discussed in the reference by Won Jong Yoo et al. entitled "Control of Etch Slope During Etching of Pt in $Ar/Cl_2/O_2$ Plasmas", Jpn. J. Appl. Phys., Vol. 35, 1996, pp. 2501–2504, Part 1, No. 4B, April 1996. This reference is hereby incorporated herein in its entirety by reference. As discussed in this reference, the sidewall redeposits may remain even after ashing the photoresist mask off.

As further discussed in, the Yoo et al. reference, an etchant gas including a mixture of Ar and $Cl_2$ with more than 50% $Cl_2$ can be reused to reduce the sidewall redeposits. While the sidewall redeposits may be reduced, however, the mask may be damaged by the $Cl_2$ gas. Accordingly, the slope of the sidewall of the etched platinum layer may be reduced.

Notwithstanding the methods discussed above, there continues to exist a need in the art for improved methods for patterning microelectronic layers.

SUMMARY OF THE INVENTION

It is therefore an object of the present invention to provide improved methods for patterning microelectronic layers.

This and other objects are provided according to the present invention by methods including the steps of forming an etching mask on a microelectronic layer wherein the etching mask defines exposed portions of the layer and wherein the etching mask has a notch in a sidewall thereof adjacent the microelectronic layer. The exposed portions of the microelectronic layer are then etched. Accordingly, a discontinuity will be provided between sidewall redeposits on the etching mask and the microelectronic layer being etched. The sidewall redeposits can thus be removed when removing the etching mask.

More particularly, the step of forming the etching mask can include the steps of forming a first patterned mask layer of a first mask material on the layer to be etched, and forming a second patterned mask layer of a second mask material on the first patterned mask layer wherein the first and second mask materials are different and wherein the second patterned mask layer extends beyond the first patterned mask layer thereby defining a notch in the sidewall of the etching mask adjacent the layer to be etched. The first mask material can be Ti, TiN, or W, and the second mask material can be $SiO_2$ or $Si_3N_4$. Moreover, the layer being etched can be Pt, Ir, Ru, BST, or PZT.

Alternately, the etching mask can be a negative photoresist mask. As a result of interference of light through a photomask used to pattern the photoresist mask, the negative photoresist will have a notch at a base thereof adjacent the layer to be etched.

According to another aspect of the present invention, a method can be provided for forming a capacitor for a microelectronic device. This method includes the steps of forming an interlayer dielectric on a microelectronic substrate wherein the interlayer dielectric has a contact hole therein exposing a portion of the microelectronic substrate, and forming a conductive via in the contact hole. A conductive layer is formed on the interlayer dielectric and on the conductive via opposite the microelectronic substrate. An etching mask is formed on the conductive layer opposite the microelectronic substrate wherein the etching mask defines exposed portions of the conductive layer and wherein the etching mask has a notch in a sidewall thereof adjacent the conductive layer. The exposed portions of the conductive layer are etched thereby providing a capacitor storage electrode on the interlayer dielectric and on the conductive via. The etching mask is then removed, and a capacitor dielectric layer is formed on the capacitor storage electrode opposite the microelectronic substrate. A capacitor plate electrode is formed on the capacitor dielectric layer opposite the storage electrode.

According to the methods discussed above, a notch can be provided in an etching mask thereby producing a discontinuity between sidewall redeposits on the etching mask and the layer being etched. These discontinuities thus allow the sidewall redeposits to be removed during the step of removing the etching mask. Moreover, the methods of the present invention can be used to provide improved storage electrodes for microelectronic capacitors.

DETAILED DESCRIPTION

Figure 1:
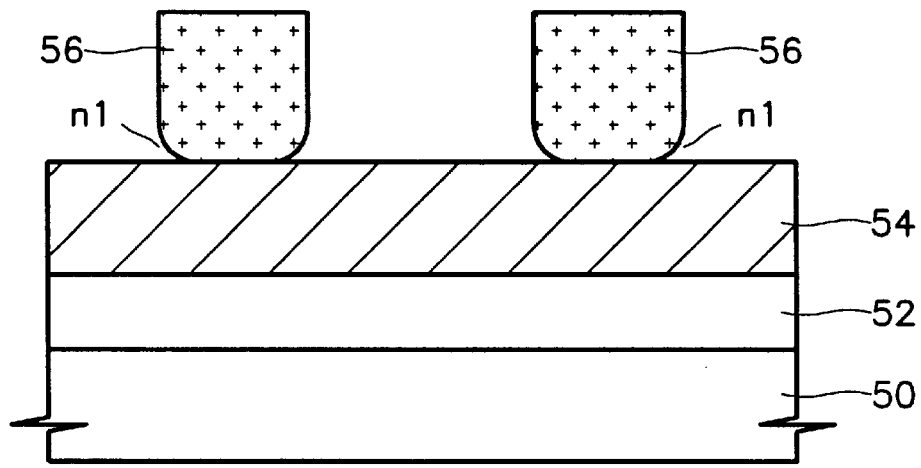
FIGS. 1 through 3 are cross-sectional views illustrating steps of a first method for forming a patterned microelectronic layer according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2:
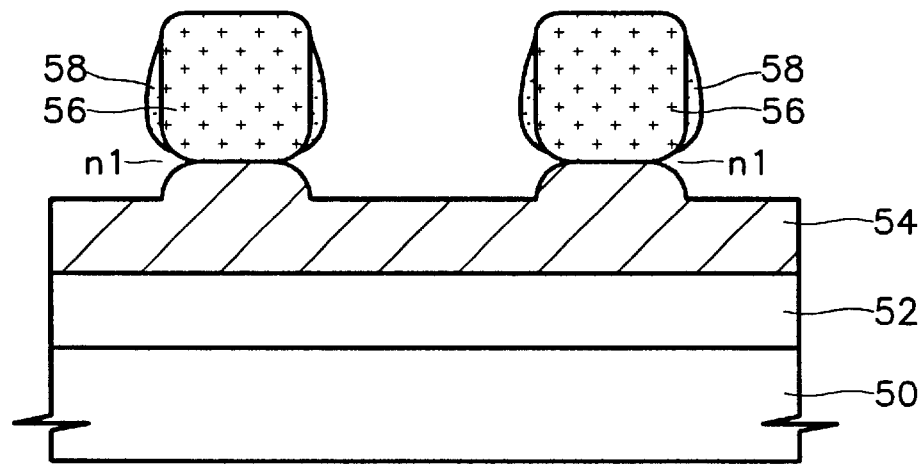
Figure 3:
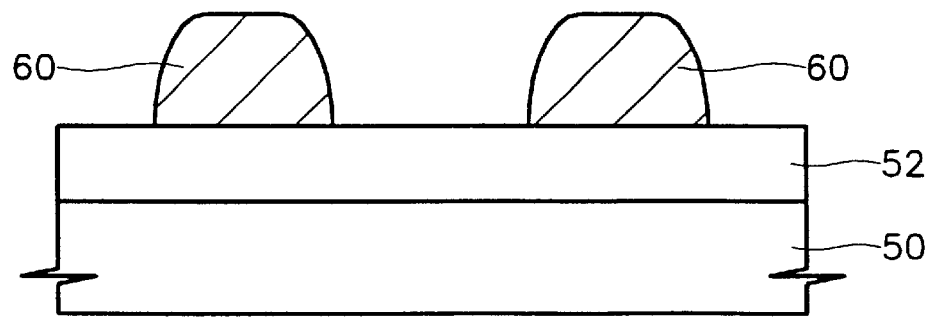

FIGS. 1 through 3 are cross-sectional views illustrating steps of a first method for forming a patterned microelectronic layer according to the present invention. As shown in FIG. 1, an interlayer dielectric 52 is formed on a semiconductor substrate 50, and a layer 54 of a material such as platinum (Pt) is formed on the interlayer dielectric 52. A mask layer 56 is then formed on the layer 54. In particular, the mask layer 56 is formed by coating a layer of a negative photoresist on the layer 54 and patterning the negative photoresist layer using exposure and development techniques. The exposed portions of the negative photoresist are hardened by the cross-linking of polymers, and the hardened portions of the negative photoresist remain after the development thereof. These hardened portions of the negative photoresist thus make up the mask layer 56.

As a result of the exposure and development steps, notches n1 are formed along the sidewalls of the mask layer 56 adjacent the layer 54 to be patterned. These notches are formed because the intensity of light irradiated through the transmitting areas of a photomask are reduced at the edge of the transmitting area as a result of interference and defraction of light. In other words, the notch n1 is formed between the mask layer 56 and the layer 54 as a result of the use of the negative photoresist as opposed to a positive photoresist as has been used in conventional methods. Alternately, the layer 54 may comprise Ir, Ru, BST, or PZT which may also be difficult to pattern using conventional reactive ion etching techniques.

As shown in FIG. 2, the Pt layer 54 is etched using the mask pattern 56 as an etching mask. For example, the Pt layer 54 can be etched using a magnetically enhanced reactive ion etching (MERIE) technique with an etchant gas including a mixture of $Ar/Cl_2/O_2$. Etch products such as Pt and compounds of Pt and $Cl_2$ may be generated during the step of etching the Pt layer 54. Some of these etch products may be exhausted to the outside of the etching chamber. Some of the etch products, however, may be redeposited onto sidewalls of the mask layer 56 thereby forming sidewall redeposits 58.

Accordingly, it is preferable to maintain a relatively low pressure inside the etching chamber to reduce the redeposition of Pt and compounds of Pt and $Cl_2$ onto the sidewalls of the mask pattern 56. In particular, it may be preferable to maintain a pressure of less than approximately 10 mTorr. By doing so, the mean free path of a Pt atom removed by ion bombardment is increased, and the direction of the Pt atom is induced to be more vertical with respect to the Pt layer 54.

As shown in FIG. 3, the etch is completed through the Pt layer 54, and the mask pattern 56 is removed using a photoresist ashing technique. The resulting Pt electrode pattern is designated by reference number 60. Because the notches n1 are formed in the mask layer 56 adjacent the Pt layer 54, discontinuities result between the sidewall redeposits 58 and the Pt layer 54. Stated in other words, the sidewall redeposits 58 adhere to the masking layer 56 but not the platinum layer 54. Accordingly, the step of removing the mask layer 56 also results in the removal of the sidewall redeposits 58.

According to the method discussed above with reference to FIGS. 1 through 3, a negative photoresist is used to provide the masking layer as opposed to a positive photoresist. Accordingly, when etching a layer of a material which generates a relatively large amount of reaction products during the etch, a discontinuity is provided between sidewall redeposits on the mask layer and the layer being etched. Accordingly, the sidewall redeposits can be removed during the step of removing the mask layer.

FIGS. 4 through 7 are cross-sectional views illustrating steps of a second method for patterning a microelectronic layer according to the present invention. This second method differs from the first method discussed above in that the etching mask is formed from first and second masking sub-layers. More particularly, the first mask sub-layer adjacent the material being etched comprises a first material and the second mask sub-layer on the first mask sub-layer opposite the substrate comprises a second material wherein the first material has a higher etch rate than the second material. Accordingly, the second mask sub-layer can be used to pattern the first mask sub-layer, and by etching an undercut between the second mask sub-layer and the material being patterned, a notch can be provided.

Figure 4:
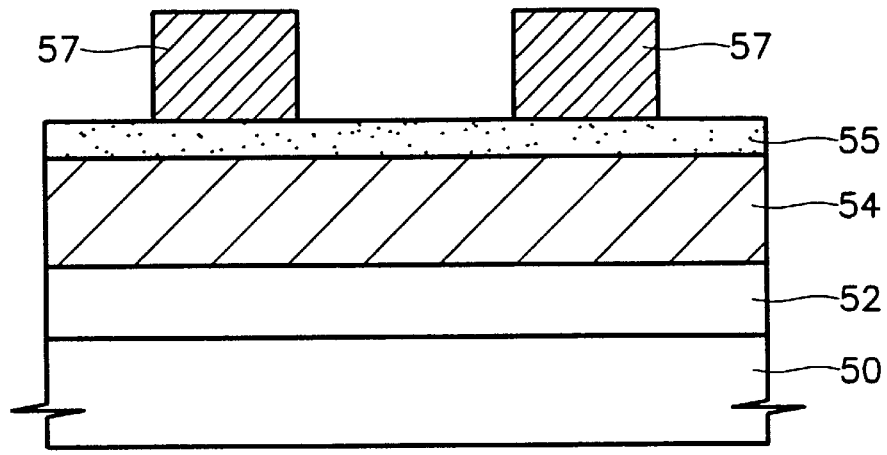
FIGS. 4 through 7 are cross-sectional views illustrating steps of a second method for forming a patterned microelectronic layer according to the present invention.

As shown in FIG. 4, an interlayer dielectric 52 is formed on a semiconductor substrate 50, and a platinum layer 54 is formed on the interlayer dielectric 52. A first mask sub-layer 55 is then formed on the platinum layer 54, and a second mask sub-layer is formed on the first mask sub-layer 55. The second mask sub-layer is patterned to provide the second mask pattern 57 shown in FIG. 4. More particularly, the first mask sub-layer 55 can be a layer of Ti, TiN, or W, and the second mask sub-layer can be a layer of a solid insulating material such as silicon nitride or silicon oxide.

Figure 5:
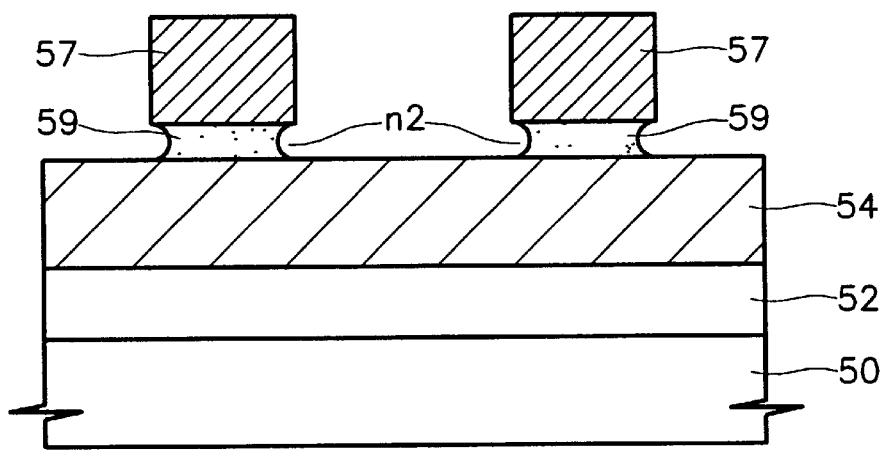
Figure 6:
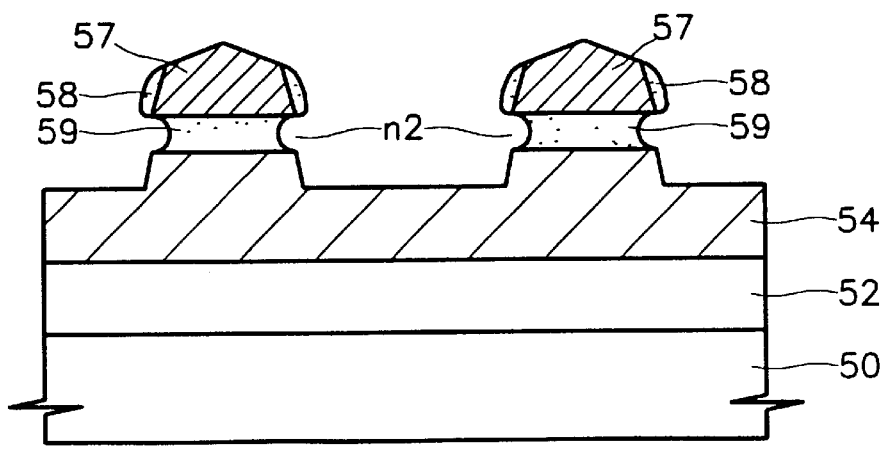

The first mask sub-layer 55 is then etched using the second mask pattern 57 as an etching mask thereby forming the first mask pattern 59 as shown in FIG. 5. By undercutting the second mask pattern 57, the notches n2 are provided. For example, if the first mask sub-layer 55 can be a layer of TiN. The first mask sub-layer can be patterned and the notch n2 can be formed by dipping the structure in a mixture of $H_2SO_4/H_2O_2$ or in a mixture of $H_2O_2/NH_4OH/H_2O$. Alternately, the first mask sub-layer 55 can be patterned and the notch n2 can be formed using a diluted HF solution of not more than 1% when the first mask sub-layer 55 is a layer of Ti or W. The notch n2 results in discontinuity between sidewall redeposits and the layer 54 being patterned.

The Pt layer 54 is then etched using the first and second mask patterns 59 and 57 as the etching mask. As discussed above with reference to FIGS. 1 through 3, a discontinuity is provided between the sidewall redeposits 58 generated during the etch and the layer 54 being etched as a result of the notch n2. Furthermore, it is possible to reduce the sidewall redeposits 58 on the sidewall of the second mask pattern 57 by maintaining a low pressure inside the etching chamber.

Figure 7:
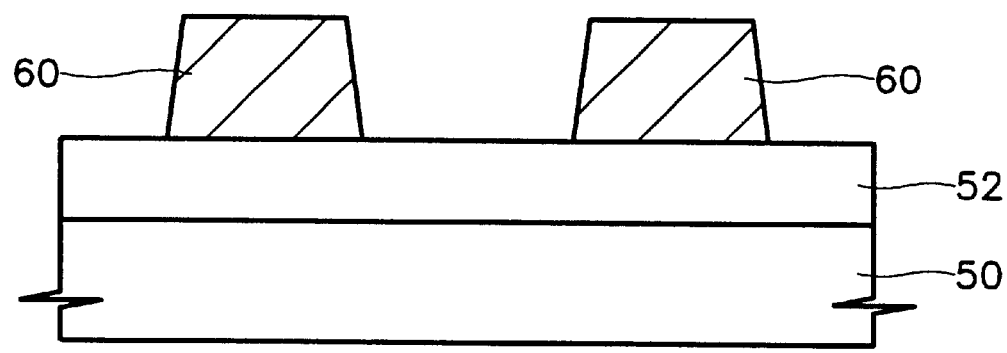

The etching of the platinum layer 54 is completed and the first and second mask patterns 59 and 57 are removed thereby providing the platinum electrode pattern 60 as shown in FIG. 7. As discussed above with reference to FIGS. 1 through 3, the sidewall redeposits 58 are removed during the step of removing the second mask pattern 57. In particular, the notches n2 result in discontinuities between the sidewall redeposits 58 and the layer 54 being etched so that the sidewall redeposits are removed with the second mask pattern 57.

According to the second method of the present invention, the first mask pattern has a notch therein between the second mask pattern and the platinum layer being etched. Accordingly, discontinuities are formed between the sidewall redeposits on the second mask pattern and the platinum layer being etched because the redeposits are not formed in the notch. The sidewall redeposits on the second mask pattern can thus be removed during the step of removing the second mask pattern.

Figure 8:
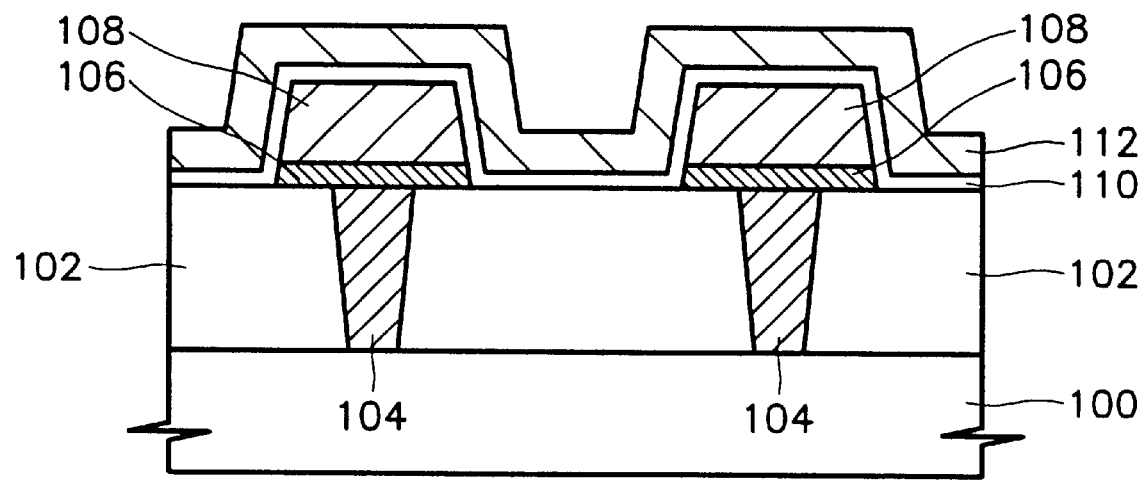
FIG. 8 is a cross-sectional view illustrating a capacitor formed by a method according to the present invention.

FIG. 8 is a cross-sectional view illustrating a capacitor formed using a method according to the present invention. As shown in FIG. 8, an interlayer dielectric 102 is formed on a semiconductor substrate 100 by depositing an insulating material such as an oxide or a nitride. A contact hole is formed in the interlayer dielectric 102 thereby exposing a portion of the substrate 100, and a conductive via 104 is formed on the contact hole by depositing a conductive material such as polysilicon on the interlayer dielectric and flattening it through an etch back step or a chemical-mechanical polishing step.

A barrier layer 106 is formed by depositing a barrier metal such as TiN on the conductive via 104 and on the interlayer dielectric 102. A platinum layer 108 is formed by depositing a layer of platinum on the barrier layer 106. A storage electrode 108 is then formed by patterning the platinum layer using a method as discussed above with regard to FIGS. 1 through 3 or with regard to FIGS. 4 through 7. The barrier layer 106 can be patterned simultaneously. In addition, a titanium silicide layer can be formed between the barrier layer 106 and the conductive plug 104 to improve contact resistance therebetween. The barrier layer 106 reduces diffusion of silicon from the conductive plug 104 and improves adhesion between the interlayer dielectric 102 and the platinum storage electrode 108.

A dielectric layer 110 is formed by depositing a dielectric material such as BST on the storage electrode 108. A plate electrode 112 is then formed on the dielectric layer 110 by depositing a layer of platinum thereon. A storage electrode for a capacitor of a microelectronic device can thus be patterned and redeposits generated on the etch mask during the step of etching the electrode pattern can be removed during the step of removing the etch mask.

According to the methods of the present invention, a notch is provided at the base of the etch mask used to etch layers of materials such as platinum which may generate etch products and redeposits during the etching thereof. Accordingly, discontinuities are formed between sidewall redeposits on the etch mask and the layer being etched because sidewall redeposits are not significantly formed in the notch portion of the etch mask. It is thus possible to remove the sidewall redeposits during the step of removing the etch mask.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for patterning a layer of a microelectronic device, said method comprising the steps of:

forming a layer of a material to be patterned on a microelectronic substrate;

forming an etching mask on said material layer opposite said microelectronic substrate wherein said etching mask defines exposed portions of said material layer and wherein said etching mask has a notch in a sidewall thereof adjacent said material layer wherein said step of forming said etching mask comprises the steps of, forming a first patterned mask layer comprising a first mask material on said material layer, and forming a second patterned mask layer comprising a second mask material on said first patterned mask layer wherein said first and second mask materials are different and wherein said second patterned mask layer extends beyond said first patterned mask layer thereby defining said notch in said sidewall of said etching mask adjacent said material layer; and etching said exposed portions of said material layer defined by said etching mask.

2. A method for patterning a layer of a microelectronic device, said method comprising the steps of:

forming a layer of a material to be patterned on a microelectronic substrate;

forming an etching mask on said material layer opposite said microelectronic substrate wherein said etching mask defines exposed portions of said material layer and wherein said etching mask has a notch in a sidewall thereof adjacent said material layer wherein said step of forming said etching mask comprises the steps of, forming a first masking layer comprising a first mask material on said material layer opposite said substrate, forming a second masking layer comprising a second mask material on said first masking layer opposite said substrate wherein said first mask material and said second mask material are different, patterning said second masking layer thereby exposing portions of said first masking layer, and etching said first masking layer using said second patterned masking layer as a mask so that a portion of said second patterned masking layer extends beyond said etched first masking layer thereby exposing said exposed portions of said material layer and defining said notch in said sidewall of said etching mask adjacent said material layer; and etching said exposed portions of said material layer defined by said etching mask.

3. A method according to claim 2 wherein said first masking material has a higher etch rate during said etching step than said second masking material.

4. A method according to claim 2 wherein said first mask material is chosen from the group consisting of Ti, TiN, and W.

5. A method according to claim 2 wherein said first mask material is chosen from the group consisting of Ti and W, and wherein said step of etching said first mask layer comprises etching said first mask layer with HF.

6. A method according to claim 5 wherein said HF is diluted to not more than 1%.

7. A method according to claim 2 wherein said first mask material comprises TiN, and wherein said step of etching said first mask layer comprises etching said first mask layer with an etchant chosen from the group consisting of $H_2SO_4/H_2O_2$ and $H_2O_2/NH_4OH/H_2O$.

8. A method according to claim 2 wherein said second mask material is chosen from the group consisting of $SiO_2$ and $Si_3N_4$.

9. A method for patterning a layer of a microelectronic device, said method comprising the steps of:

forming a layer of a material to be patterned on a microelectronic substrate wherein said material layer comprises a material chosen from the group consisting of Pt, Ir, Ru, BST, and PZT;

forming an etching mask on said material layer opposite said microelectronic substrate wherein said etching mask defines exposed portions of said material layer and wherein said etching mask has a notch in a sidewall thereof adjacent said material layer wherein said etching mask comprises a negative photoresist; and etching said exposed portions of said material layer defined by said etching mask.

10. A method for patterning a layer of a microelectronic device, said method comprising the steps of:

forming a layer of a material to be patterned on a microelectronic substrate;

forming an etching mask on said material layer opposite said microelectronic substrate wherein said etching mask defines exposed portions of said material layer and wherein said etching mask has a notch in a sidewall thereof adjacent said material layer wherein said etching mask comprises a negative photoresist; and etching said exposed portions of said material layer defined by said etching mask wherein said step of etching said material layer comprises etching said material layer using $Ar/Cl_2/O_2$ as an etchant gas.

11. A method for patterning a layer of a microelectronic device, said method comprising the steps of:

forming a layer of a material to be patterned on a microelectronic substrate;

forming an etching mask on said material layer opposite said microelectronic substrate wherein said etching mask defines exposed portions of said material layer and wherein said etching mask has a notch in a sidewall thereof adjacent said material layer so that a portion of the sidewall at the notch is spaced apart from said layer of said material to be patterned;

etching said exposed portions of said material layer defined by said etching mask; and removing said etching mask.

12. A method according to claim 11 wherein said material layer comprises a material chosen from the group consisting of Pt, Ir, Ru, BST, and PZT.

13. A method according to claim 11 wherein said step of etching said material layer comprises etching said material layer using $Ar/Cl_2/O_2$ as an etchant gas.

14. A method according to claim 13 wherein said step of etching said material layer comprises anisotropically etching said material layer.

15. A method according to claim 13 wherein said step of etching said material layer comprises etching said material layer at a low pressure.

16. A method according to claim 13 wherein said step of etching said material layer comprises etching said material layer at a pressure of not more than 10 mTorr.

17. A method according to claim 11 wherein said etching mask comprises a negative photoresist.

18. A method for patterning a layer of a microelectronic device, said method comprising the steps of:

forming a layer of a material to be patterned on a microelectronic substrate;

forming an etching mask on said material layer opposite said microelectronic substrate wherein said etching mask defines exposed portions of said material layer and wherein said etching mask has a notch in a sidewall thereof adjacent said material layer;

etching said exposed portions of said material layer defined by said etching mask wherein said step of etching said material layer results in the formation of material redeposits on said sidewall of said etching mask; and removing said etching mask wherein said material redeposits are removed during said step of removing said etching mask.

19. A method for forming a capacitor for a microelectronic device, said method comprising the steps of:

forming an interlayer dielectric on a microelectronic substrate wherein said interlayer dielectric has a contact hole therein exposing a portion of said microelectronic substrate;

forming a conductive via in said contact hole;

forming a conductive layer on said interlayer dielectric and on said conductive via opposite said microelectronic substrate;

forming an etching mask on said conductive layer opposite said microelectronic substrate wherein said etching mask defines exposed portions of said conductive layer and wherein said etching mask has a notch in a sidewall thereof adjacent said conductive layer;

etching said exposed portions of said conductive layer defined by said etching mask thereby providing a capacitor storage electrode on said interlayer dielectric and on said conductive via;

removing said etching mask;

forming a capacitor dielectric layer on said capacitor storage electrode opposite said microelectronic substrate; and forming a capacitor plate electrode on said capacitor dielectric layer opposite said capacitor storage electrode.

20. A method according to claim 19 further comprising the step of forming a barrier layer between said conductive via and said conductive layer.

21. A method according to claim 19 wherein said step of forming said etching mask comprises the steps of:

forming a first patterned mask layer comprising a first mask material on said conductive layer; and forming a second patterned mask layer comprising a second mask material on said first patterned mask layer wherein said first and second mask materials are different and wherein said second patterned mask layer extends beyond said first patterned mask layer thereby defining said notch in said sidewall of said etching mask adjacent said conductive layer.

22. A method according to claim 19 wherein said step of forming said etching mask comprises the steps of:

forming a first masking layer comprising a first mask material on said conductive layer opposite said substrate;

forming a second masking layer comprising a second mask material on said first masking layer opposite said substrate wherein said first mask material and said second mask material are different;

patterning said second masking layer thereby exposing portions of said first masking layer; and etching said first masking layer using said second patterned masking layer as a mask so that a portion of said second masking layer extends beyond said etched first masking layer thereby exposing said exposed portions of said conductive layer and defining said notch in said sidewall of said etching mask adjacent said conductive layer.

23. A method according to claim 22 wherein said first mask material is chosen from the group consisting of Ti, TiN, and W.

24. A method according to claim 22 wherein said second mask material is chosen from the group consisting of $SiO_2$ and $Si_3N_4$.

25. A method according to claim 19 wherein said conductive layer comprises a material chosen from the group consisting of Pt, Ir, Ru, BST, and PZT.

26. A method according to claim 19 wherein said etching mask comprises a negative photoresist.

27. A method according to claim 26 wherein said conductive layer comprises a material chosen from the group consisting of Pt, Ir, Ru, BST, and PZT.

28. A method according to claim 26 wherein said step of etching said conductive layer comprises etching said conductive layer using $Ar/Cl_2/O_2$ as an etchant gas.

29. A method according to claim 19 wherein said step of etching said conductive layer results in the formation of material redeposits on said sidewall of said etching mask, and wherein said material redeposits are removed during said step of removing said etching mask.

30. A method according to claim 19 wherein said capacitor dielectric layer comprises a material chosen from the group consisting of BST and PZT.

31. A method according to claim 19 wherein said plate electrode comprises a material chosen from the group consisting of Pt, Ir, and Ru.

* * * * *